(12) United States Patent
Adrian

(10) Patent No.: US 10,349,554 B2
(45) Date of Patent: Jul. 9, 2019

(54) APPARATUS, SYSTEM, AND METHOD FOR DIRECTING AIR IN A STORAGE-SYSTEM CHASSIS

(71) Applicant: Facebook, Inc., Menlo Park, CA (US)

(72) Inventor: Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/689,650

(22) Filed: Aug. 29, 2017

(65) Prior Publication Data

US 2019/0069440 A1 Feb. 28, 2019

(51) Int. Cl.
| | | |
|---|---|---|
| H05K 7/20 | (2006.01) | |
| H05K 7/14 | (2006.01) | |
| H05K 7/18 | (2006.01) | |

(52) U.S. Cl.
CPC ....... H05K 7/20145 (2013.01); H05K 7/1421 (2013.01); H05K 7/18 (2013.01); H05K 7/20563 (2013.01)

(58) Field of Classification Search
CPC .......... H05K 7/20145; H05K 7/20563; H05K 7/1421; H05K 7/18; H05K 7/20572; H05K 7/01; G06F 1/20; G06F 1/187; G06F 1/181; G06F 1/185; G06F 1/183; G06F 3/0689; G06F 13/4068; G06F 13/409; G06F 11/0727; G06F 11/201; G06F 1/184; G06F 3/0653
USPC ...... 361/695, 679.33, 679.46, 679.49, 679.5, 361/679.51, 688, 690; 165/80.2; 454/284
See application file for complete search history.

(56) References Cited

U.S. PATENT DOCUMENTS

| | | | |
|---|---|---|---|
| 3,996,500 | A | 12/1976 | Coules |
| 294,800 | A | 3/1988 | Nilsson |
| 4,969,065 | A | 11/1990 | Petri |
| 5,281,149 | A | 1/1994 | Petri |
| 5,724,803 | A | 3/1998 | Pea |
| 5,793,614 | A | 8/1998 | Tollbom |
| 5,957,659 | A | 9/1999 | Amou |

(Continued)

OTHER PUBLICATIONS

Jason David Adrian et al.; Apparatus, System, and Method for Reconfigurable Media-Agnostic Storage; U.S. Appl. No. 15/694,068, filed Sep. 1, 2017.

(Continued)

*Primary Examiner* — Mandeep S Buttar
(74) *Attorney, Agent, or Firm* — FisherBroyles, LLP

(57) ABSTRACT

A cold-air bypass apparatus may include (1) a mount configured to couple the cold-air bypass apparatus to a drive-plane board housed within a storage-system chassis and (2) a baffle configured to direct a portion of an airflow through an opening in the drive-plane board from below the drive-plane board to above the drive-plane board. The drive-plane board may include (1) a front drive section that includes storage-drive connectors coupled to the drive-plane board, (2) a rear drive section that includes additional storage-drive connectors coupled to the drive-plane board, and (3) the opening located between the front drive section and the rear drive section that allows air to flow from below the drive-plane board to above the drive-plane board. Various other apparatus, systems, and methods for directing air in a storage-system chassis are also disclosed.

20 Claims, 16 Drawing Sheets

(56) References Cited

U.S. PATENT DOCUMENTS

| | | | |
|---|---|---|---|
| 6,109,767 | A | 8/2000 | Rodriguez |
| 6,116,375 | A | 9/2000 | Lorch |
| 6,159,031 | A | 12/2000 | Llapitan |
| 6,181,549 | B1 | 1/2001 | Mills |
| 6,404,646 | B1 | 6/2002 | Tsai |
| 6,469,899 | B2 | 10/2002 | Hastings |
| 6,515,854 | B1 | 2/2003 | Claprood |
| 6,621,692 | B1 | 9/2003 | Johnson |
| 6,791,843 | B1 | 9/2004 | Dobbs |
| 6,798,669 | B1 | 9/2004 | Hsu |
| 6,813,165 | B2 | 11/2004 | Cheng |
| 6,987,674 | B2 | 1/2006 | El-Batal |
| 6,995,982 | B2 | 2/2006 | Gonzalez |
| 7,004,764 | B2 | 2/2006 | Boudreau |
| 7,084,654 | B2 | 8/2006 | Zhao |
| 7,088,579 | B1 | 8/2006 | Konshak |
| 7,167,371 | B2 | 1/2007 | Coles |
| 7,301,778 | B1 | 11/2007 | Fang |
| 7,411,787 | B2 * | 8/2008 | Katakura ............... G11B 33/14 361/695 |
| 7,505,286 | B2 | 3/2009 | Brovald |
| 7,515,413 | B1 | 4/2009 | Curtis |
| 7,649,750 | B2 | 1/2010 | Lee |
| 8,020,902 | B1 | 9/2011 | Li |
| 8,310,828 | B2 | 11/2012 | Collins |
| 8,570,720 | B2 | 10/2013 | Yao |
| 8,657,619 | B2 | 2/2014 | Lin |
| 8,749,966 | B1 | 6/2014 | Boudreau |
| 8,848,349 | B2 | 9/2014 | Ke |
| 8,944,538 | B2 | 2/2015 | Li |
| 8,971,052 | B2 | 3/2015 | Fu |
| 9,066,438 | B2 | 6/2015 | Chen |
| 9,070,419 | B1 | 6/2015 | Zhu |
| 9,098,233 | B2 | 8/2015 | Keffeler |
| 9,101,210 | B2 | 8/2015 | Lin |
| 9,203,188 | B1 | 12/2015 | Siechen |
| 9,354,003 | B2 | 5/2016 | Lin |
| 9,456,519 | B2 | 9/2016 | Bailey |
| 9,461,389 | B2 | 10/2016 | Novack |
| 9,538,684 | B2 | 1/2017 | Chen |
| 9,545,028 | B2 | 1/2017 | Hoshino |
| 9,572,276 | B2 | 2/2017 | Haroun |
| 9,583,877 | B1 | 2/2017 | Angelucci |
| 9,609,778 | B1 | 3/2017 | Spencer |
| 9,763,350 | B2 | 9/2017 | Rust |
| 9,795,052 | B2 | 10/2017 | Hsiao |
| 9,949,407 | B1 * | 4/2018 | Beall ................. H05K 7/20736 |
| 2003/0183448 | A1 | 10/2003 | Sleet |
| 2005/0238421 | A1 | 10/2005 | Doerr |
| 2006/0134953 | A1 | 6/2006 | Williams |
| 2006/0274508 | A1 | 12/2006 | Lariviere |
| 2007/0195542 | A1 | 8/2007 | Metros |
| 2007/0230111 | A1 | 10/2007 | Starr |
| 2007/0233781 | A1 | 10/2007 | Starr |
| 2008/0007913 | A1 * | 1/2008 | Sullivan ............. H05K 7/20636 361/699 |
| 2008/0117569 | A1 | 5/2008 | Lee |
| 2009/0245745 | A1 | 10/2009 | Krampotich |
| 2009/0271950 | A1 | 11/2009 | Wang |
| 2009/0274429 | A1 | 11/2009 | Krampotich |
| 2009/0310303 | A1 | 12/2009 | Najbert |
| 2010/0195304 | A1 | 8/2010 | Takao |
| 2010/0296791 | A1 | 11/2010 | Makrides-Saravanos |
| 2011/0273850 | A1 | 11/2011 | Chen |
| 2011/0309730 | A1 | 12/2011 | Retchloff |
| 2012/0004772 | A1 | 1/2012 | Rahilly |
| 2012/0020006 | A1 | 1/2012 | Xu |
| 2012/0134086 | A1 | 5/2012 | Zhang |
| 2012/0230815 | A1 | 9/2012 | Teramoto |
| 2012/0257360 | A1 | 10/2012 | Sun |
| 2012/0305745 | A1 | 12/2012 | Chen |
| 2013/0058054 | A1 | 3/2013 | Zhou |
| 2013/0258580 | A1 * | 10/2013 | Nakayama ........... G11B 33/128 361/679.33 |
| 2013/0325183 | A1 | 12/2013 | Rahilly |
| 2014/0111930 | A1 | 4/2014 | Henderson |
| 2014/0187068 | A1 | 7/2014 | Chia |
| 2014/0191636 | A1 | 7/2014 | Li |
| 2014/0369002 | A1 | 12/2014 | Takeuchi |
| 2015/0156912 | A1 | 6/2015 | Liang |
| 2015/0163946 | A1 | 6/2015 | Kyle |
| 2015/0208548 | A1 | 7/2015 | Chu |
| 2015/0235673 | A1 | 8/2015 | Lo |
| 2016/0150659 | A1 | 5/2016 | Chen |
| 2016/0150667 | A1 | 5/2016 | Xu |
| 2016/0330858 | A1 | 11/2016 | Ehlen |

OTHER PUBLICATIONS

Jason David Adrian; Apparatus, System, and Method for Indicating the Status of and Securing Hard Drives; U.S. Appl. No. 15/700,112, filed Sep. 9, 2017.

Jason David Adrian et al.; Apparatus, System, and Method for Enabling Multiple Storage-System Configurations; U.S. Appl. No. 15/688,830, filed Aug. 28, 2017.

Jason David Adrian et al.; Apparatus, System, and Method for Securing Hard Drives in a Storage Chassis; U.S. Appl. No. 15/697,405, filed Sep. 6, 2017.

Jason David Adrian; Apparatus, System, and Method for Detecting Device Types of Storage Devices; U.S. Appl. No. 15/698,540, filed Sep. 7, 2017.

Chuankeat Kho et al.; Removeable Drive-Plane Apparatus, System, and Method; U.S. Appl. No. 15/693,362, filed Aug. 31, 2017.

Chuankeat Kho et al.; Systems and Methods for Mounting Assembly Pull-Handles; U.S. Appl. No. 15/687,406, filed Aug. 25, 2017.

Open Compute Project; http://opencompute.org/; as accessed Sep. 29, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607, filed Sep. 23, 2017.

Chuankeat Kho et al.; Apparatus, System, and Method for Partitioning a Storage-System Chassis; U.S. Appl. No. 15/708,069, filed Sep. 18, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

Acoustic Attenuation; https://en.wikipedia.org/wiki/Acoustic_attenuation; Oct. 22, 2012.

Electromagnetic Shielding; https://en.wikipedia.org/wiki/Electromagnetic_shielding; May 15, 2016.

\* cited by examiner

APPARATUS, SYSTEM, AND METHOD FOR DIRECTING AIR IN A STORAGE-SYSTEM CHASSIS

BACKGROUND

Today, many entities must create and manage complex data storage centers capable of storing and accessing hundreds of terabytes of data (e.g., text, image, and video data) that are generated and consumed every day by their users. These complex data storage centers may also need to create and store duplicate copies of this data for disaster-recovery, testing, regulatory, or other purposes. To cope with these storage needs, existing data storage centers often have hundreds or thousands of petabytes of storage capacity.

As needs for storage capacity increases, storage-system providers have attempted to meet these needs with storage systems having higher levels of storage density. In some cases, high-density storage systems simply have more storage drives packed into their chassis than their lower-density storage-system counterparts. As more and more storage drives are incorporated into a typical storage-system chassis, the task of cooling the storage drives may become more difficult. Typically, the operating temperature of each storage drive within a storage-system chassis must be maintained within a specific operating temperature range. A typical rack-mounted storage-system chassis may contain many rows of storage drives that are cooled by air that passes through the chassis from the front of the chassis to the rear of the chassis. Unfortunately, the temperature of the air may rise as the air passes by each row of storage drives in the chassis. As such, a typical rack-mounted storage-system chassis may require a large airflow to ensure that each storage drive in its most rearward row of storage drives is maintained within an appropriate operating temperature range.

SUMMARY

As will be described in greater detail below, the instant disclosure describes various apparatus, systems and methods for directing air in a storage-system chassis. In some examples, a cold-air bypass apparatus may include (1) a mount configured to couple the cold-air bypass apparatus to a drive-plane board configured to be housed within a storage-system chassis and (2) a baffle configured to direct a portion of an airflow through an opening in the drive-plane board from below the drive-plane board to above the drive-plane board. The storage-system chassis may include a front through which air is able to pass, a left side through which substantially no air is able to pass, a right side through which substantially no air is able to pass, and a rear through which air is able to pass. A fan may direct the airflow rearward through the chassis. In addition, the drive-plane board may include (1) a front drive section located on a top side of the drive-plane board that includes a first plurality of storage-drive connectors coupled to the drive-plane board, (2) a rear drive section located on the top of the drive-plane board that includes a second plurality of storage-drive connectors coupled to the drive-plane board, and (3) the opening located between the front drive section and the rear drive section that allows air to flow from below the drive-plane board to above the drive-plane board.

In some examples, the baffle may be further configured to prevent substantially any of the airflow from flowing under the drive-plane board past the opening. In at least one example, the drive-plane board may include (1) a front printed circuit board that may include the front drive section and (2) a rear printed circuit board electrically coupled to the front printed circuit board. The rear printed circuit board may include the rear drive section, and the opening may be a gap located between the front printed circuit board and the rear printed circuit board. In at least one example, the baffle and the mount may be formed from a single injection-molded part comprised of rigid plastic, and the mount may be (1) coupled to the front printed circuit board and the rear printed circuit board and (2) configured to rigidly tie the front printed circuit board to the rear printed circuit board.

In some examples, the cold-air bypass apparatus may further include an additional baffle configured to (1) direct an additional portion of the airflow through an additional opening in the drive-plane board from below the drive-plane board to above the drive-plane board and (2) prevent substantially any of the airflow from flowing under the drive-plane board past the additional opening. In at least one example, the drive-plane board may include (1) a front printed circuit board that may include the front drive section and (2) a rear printed circuit board coupled to the front printed circuit board that includes the rear drive section. In this example, the opening may be a gap located between the front printed circuit board and the rear printed circuit board, and the additional opening may be an additional gap located between the front printed circuit board and the rear printed circuit board. In certain examples, the baffle and the mount may be formed from a first injection-molded part comprised of rigid plastic, and the mount may be (1) coupled to a left side of the front printed circuit board and a left side of the rear printed circuit board and (2) configured to rigidly tie the left side of the front printed circuit board to the left side of the rear printed circuit board. The additional baffle and an additional mount may be formed from a second injection-molded part comprised of rigid plastic, and the additional mount may be (1) coupled to a right side of the front printed circuit board and a right side of the rear printed circuit board and (2) configured to rigidly tie the right side of the front printed circuit board to the right side of the rear printed circuit board.

In some examples, the cold-air bypass apparatus may further include a third baffle that extends from the left side of the chassis to the right side of the chassis. In these examples, the third baffle may be configured to (1) retain the portion of the airflow against the drive-plane board, (2) direct the portion of the airflow to the baffle, (3) retain the additional portion of the airflow against the drive-plane board, and (4) direct the additional portion of the airflow to the additional baffle. In certain examples, the cold-air bypass apparatus may further include two or more finger holds that enable a technician to grasp and remove the drive-plane board from the chassis, and the baffle may include a duct through which the portion of the airflow may be able to pass.

According to various embodiments, a corresponding storage-system drawer may include (1) a chassis that may include (a) a front through which air may be able to pass, (b) a left side through which substantially no air may be able to pass, (c) a right side through which substantially no air may be able to pass, and (d) a rear through which air may be able to pass, (2) a fan that directs an airflow rearward through the chassis, (3) a drive-plane board that may include (a) a front drive section located on a top side of the drive-plane board that includes a first plurality of storage-drive connectors coupled to the drive-plane board, (b) a rear drive section located on the top of the drive-plane board that includes a second plurality of storage-drive connectors coupled to the drive-plane board, and (c) an opening located between the front drive section and the rear drive section that allows air to flow from below the drive-plane board to above the drive-plane board, and (4) a cold-air baffle configured to direct a portion of the airflow through the opening from below the drive-plane board to above the drive-plane board.

In some examples, the cold-air baffle may be further configured to prevent substantially any of the airflow from flowing under the drive-plane board past the opening. In at least one example, the drive-plane board may include (1) a front printed circuit board that may include the front drive section and (2) a rear printed circuit board electrically coupled to the front printed circuit board that includes the rear drive section. In this example, the opening may be a gap located between the front printed circuit board and the rear printed circuit board.

In some examples, the cold-air baffle may be made of rigid plastic, coupled to the front printed circuit board and the rear printed circuit board, and configured to rigidly tie the front printed circuit board to the rear printed circuit board. In at least one example the storage-system drawer may further include an additional cold-air baffle configured to (1) direct an additional portion of the airflow through an additional opening in the drive-plane board from below the drive-plane board to above the drive-plane board and (2) prevent substantially any of the airflow from flowing under the drive-plane board past the additional opening. In at least one example, the drive-plane board may include (1) a front printed circuit board that may include the front drive section and (2) a rear printed circuit board coupled to the front printed circuit board that includes the rear drive section, the opening may be a gap located between the front printed circuit board and the rear printed circuit board, and the additional opening may be an additional gap located between the front printed circuit board and the rear printed circuit board.

In at least one example, the cold-air baffle and the additional cold-air baffle may each be made of rigid plastic, coupled to the front printed circuit board and the rear printed circuit board, and configured to rigidly tie the front printed circuit board to the rear printed circuit board. In at least one example, the fan may be coupled to the rear of the chassis and may pull the airflow from the front of the chassis to the rear of the chassis, and the cold-air baffle may include two or more finger holds that enable a technician to grasp and remove the drive-plane board from the chassis.

In addition to the various apparatus and drawer systems described herein, the instant disclosure presents exemplary methods associated with cold-air baffles in a storage-system chassis. For example, a method may include (1) electrically coupling a front drive-plane board to a rear drive-plane board, (2) coupling a cold-air baffle to the front drive-plane board and the rear drive-plane board such that the cold-air baffle may be capable of directing a portion of an airflow that passes under the front drive-plane board to above the rear drive-plane board through a gap located between the front drive-plane board and the rear drive-plane board, and (3) installing the front drive-plane board and the rear drive-plane board within a storage-system chassis. In some examples, the front drive-plane board may include a front drive section located on a top side of the front drive-plane board that includes a first plurality of storage-drive connectors coupled to the front drive-plane board, and the rear drive-plane board may include a rear drive section located on the top of the rear drive-plane board that includes a second plurality of storage-drive connectors coupled to the rear drive-plane board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
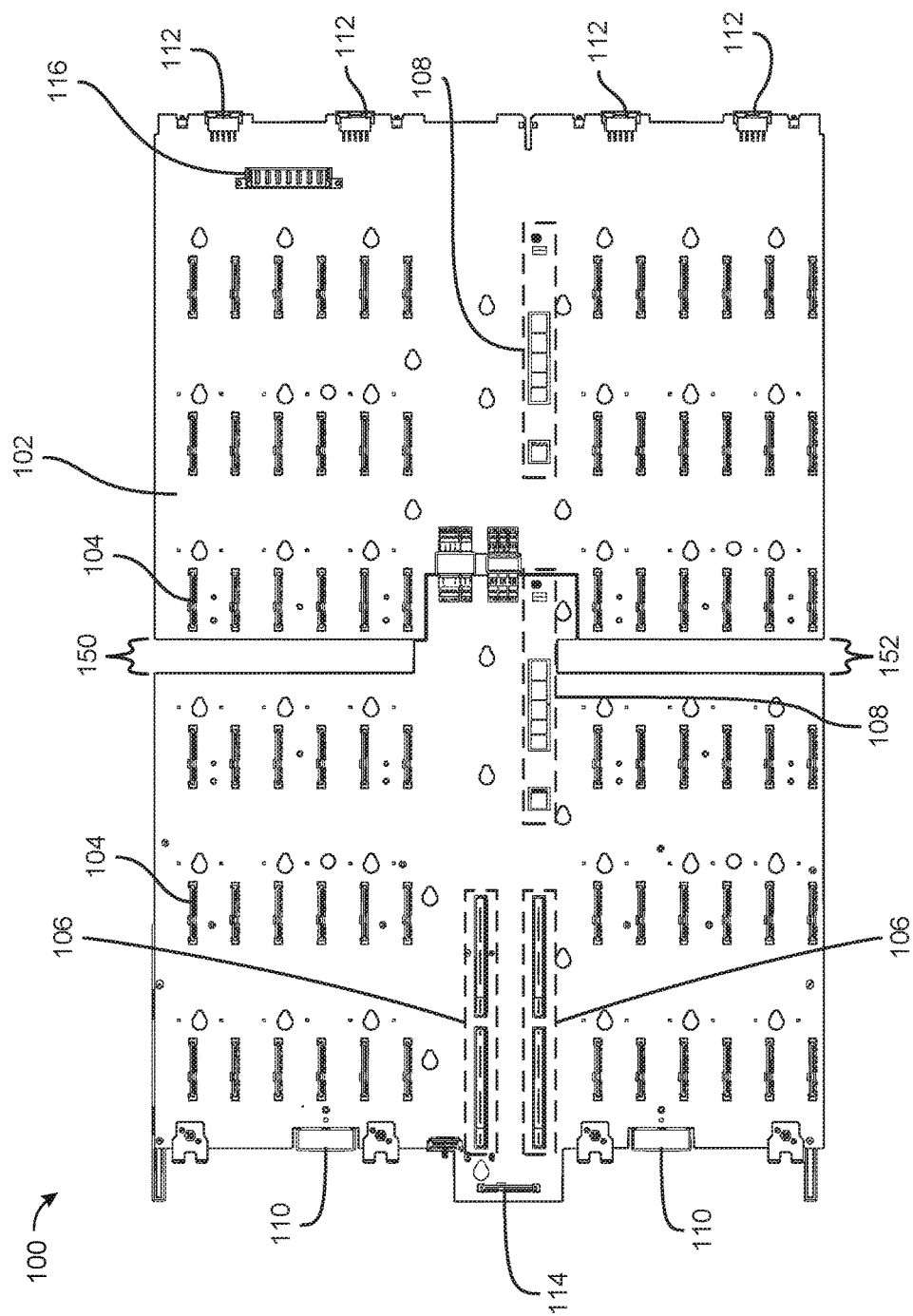
FIG. 1 is a top view of an exemplary drive-plane board.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatus, systems, and methods for directing air in a storage-system chassis. Embodiments of the instant disclosure may provide various features and advantages over conventional approaches to cooling storage drives within a storage-system chassis. As will be explained in greater detail below, by using baffles to direct an airflow from under a storage-system chassis into the chassis through an opening in the bottom of the chassis located between rows of storage drives, the apparatus, systems, and methods disclosed herein may reduce the temperature of the air that passes through rows of storage drives at the rear of the chassis. By reducing the temperature of the air that passes through more rearward rows of storage drives in the storage-system chassis, the apparatus, systems, and methods disclosed herein may negate the negative thermal impact of hot air vented from storage drives at the front of the storage-system chassis on storage drives at the rear of the chassis and/or may reduce the amount of air that must be pushed through the storage-system chassis to maintain the operating temperatures of the storage drives contained within the chassis within the appropriate range.

The following will provide, with reference to FIGS. 1-5, detailed descriptions of an example drive-plane board. Detailed descriptions of an example storage-system drawer will be provided in connection with FIGS. 6-9. Detailed descriptions of example cold-air baffles will be provided in connection with FIGS. 10-15. Detailed descriptions of an example method for integrating cold-air baffles into a drive-plane board will be provided in connection with FIG. 16.

FIG. 1 shows a top view of an example removable drive-plane board 100. Drive-plane board 100 generally represents any structure that is adapted to connect the various active components (e.g., compute modules, storage drives, storage-controller modules, and input/output modules) that make up a storage system and/or secure the components within a chassis. In some examples, drive-plane board 100 may be one or more printed circuit boards (PCBs) that include various connectors that are electrically connected by conductive traces. In some examples, drive-plane board 100 may be configured to support up to 72 storage drives, up to four fans, drive power control, sensors (e.g., temperature sensors or drawer open sensors), and power distribution.

As shown in FIG. 1, drive-plane board 100 may have a top 102 on which are mounted various types of connectors. In some examples, top 102 may include 72 storage-drive connectors 104, two compute-module connectors 106, two storage-controller connectors 108, two I/O-module connectors 110, four fan module connectors 112, a front-panel connector 114, and a power connector 116. While not shown in FIG. 1, drive-plane board 100 may include electrical conductors that electrically connect some or all of the connectors shown in FIG. 1.

Figure 5:
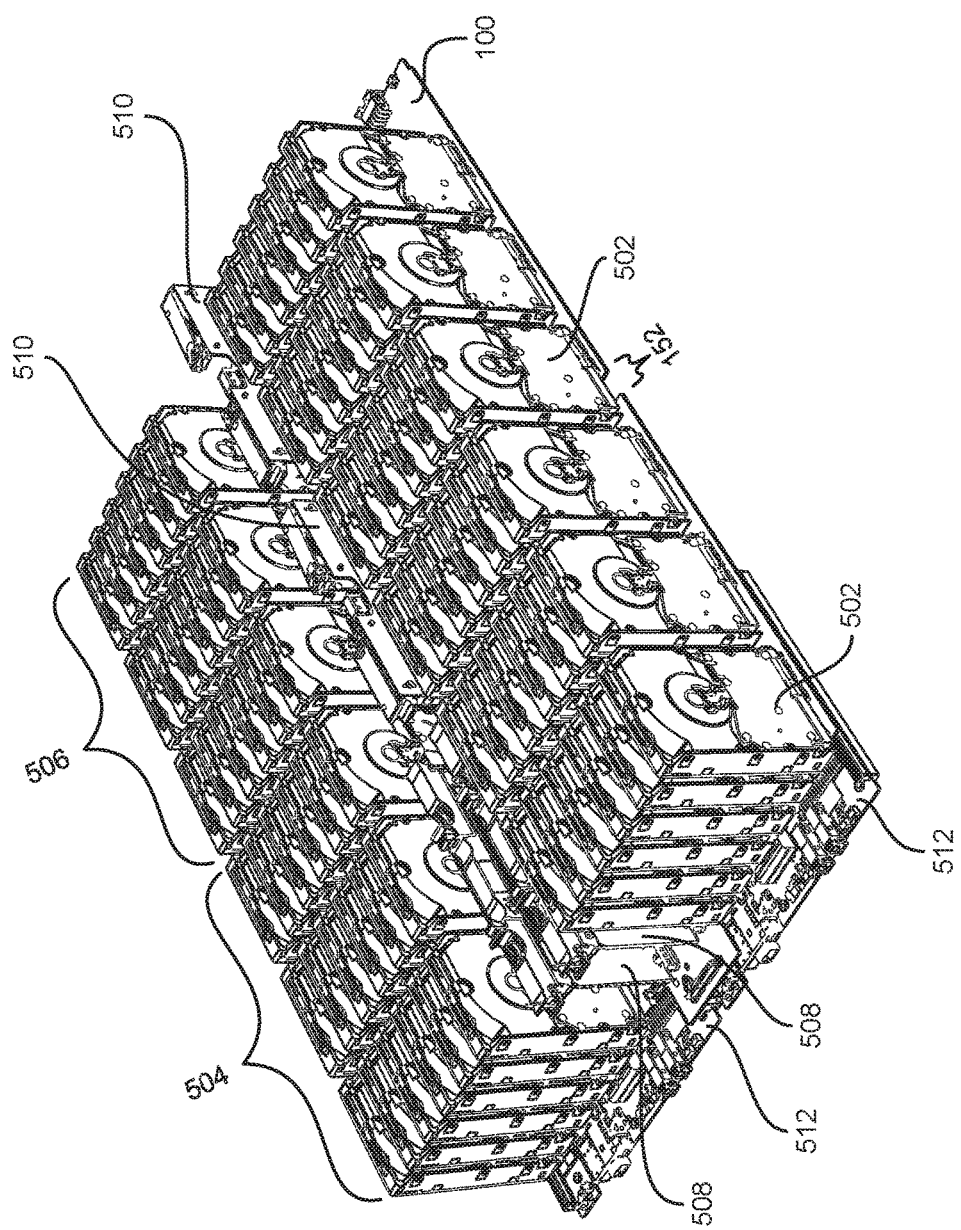
FIG. 5 is a perspective view of exemplary storage-system drives and storage-system modules.

Each of storage-drive connectors 104 may be configured to interface with a single storage drive, such as one of storage drives 502 illustrated in FIG. 5. The term "storage drive," as used herein, generally refers to any device capable of storing electronic data. In some examples, storage-drive connectors 104 may be configured to interface with solid state drives, hard disk drives, and/or optical drives. In some examples, storage-drive connectors 104 may be configured to interface with two or more different types of storage drives. For example, storage-drive connectors 104 may be configured to interface with storage drives that have different physical form factors, that are made up of different types of storage (e.g., solid state or hard disk), that use different protocols, and/or that use different types of connectors. In some examples, storage-drive connectors 104 may be configured to interface with Serial Attached Small computer system interface (SAS) drives, Serial Advanced Technology Attachment (SATA) drives, and/or Non-Volatile Memory Express (NVMe) drives. In some examples, storage-drive connectors 104 may be configured to enable hot-swapping of storage drives.

Figure 2:
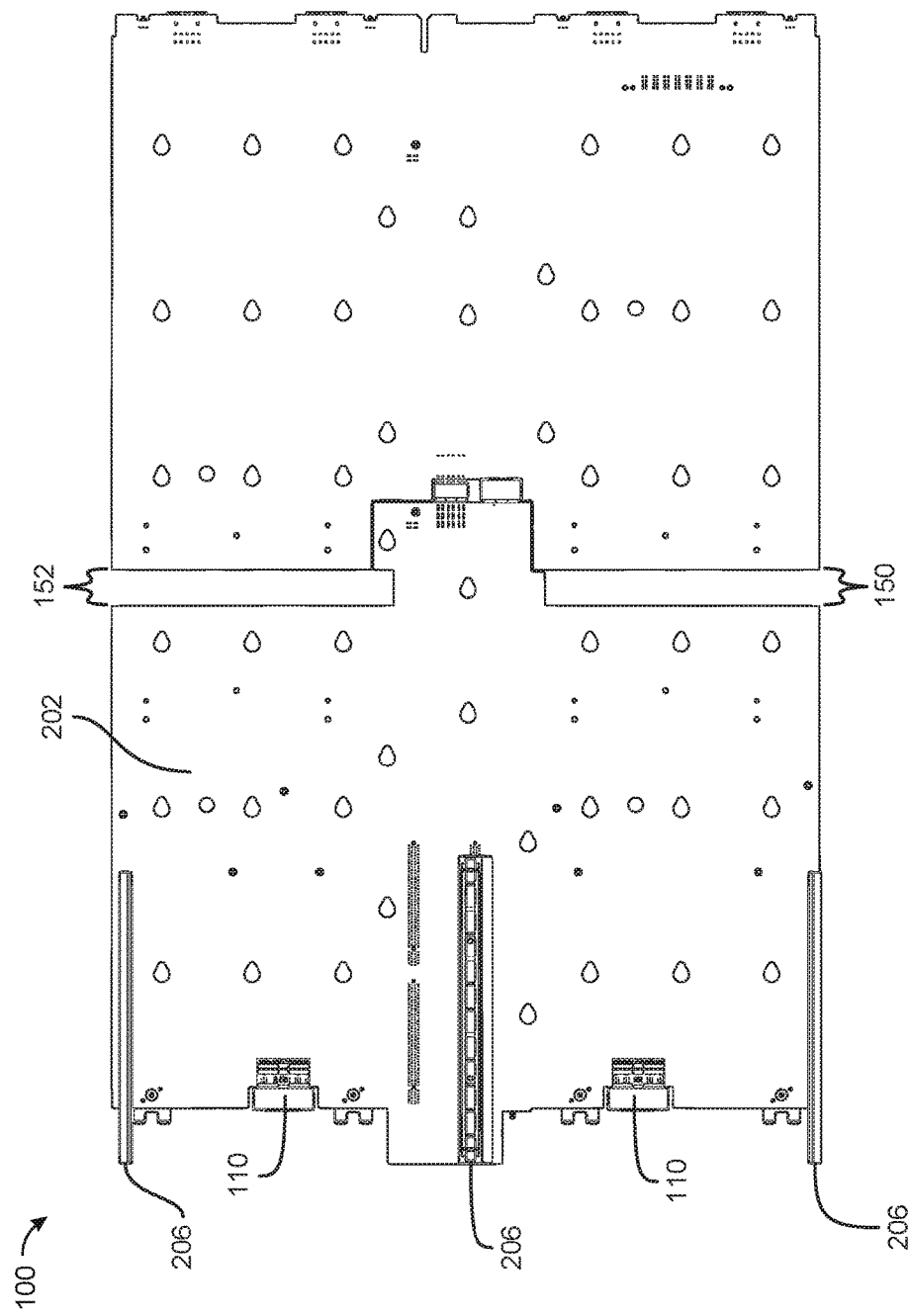
FIG. 2 is a bottom view of the exemplary drive-plane board illustrated in FIG. 1.

Each of compute-module connectors 106 may be configured to interface with a compute module, such as one of compute modules 508 in FIG. 5. The term "compute module," as used herein, generally refers to any server module whose primary function is computational and/or any server module whose primary function is to provide data storage services. In some examples, compute-module connectors 106 may be configured to interface with two or more different types of compute modules. Each of storage-controller connectors 108 may be configured to interface with a storage-controller module, such as one of storage-controller modules 510 in FIG. 5. The term "storage-controller module," as used herein, generally refers to any storage-system module whose primary function is to control and communicate with storage drives. Each of I/O-module connectors 110 may be configured to interface with an I/O module, such as one of I/O modules 512 in FIG. 5. The term "I/O module," as used herein, generally refers to any storage-system module whose primary function is to facilitate data transfer in and out of a storage system. In some examples, as shown in FIG. 2, drive-plane board 100 may also include rails 206 that are configured to secure an I/O-module drawer containing an I/O module.

Drive-plane board 100 may include various openings that allow air to flow between top 102 of drive-plane board 100 and bottom 202 of drive-plane board 100 when drive-plane board 100 is installed in a storage-system drawer. As shown in FIGS. 1-4, drive-plane board 100 may include a left gap 150 and a right gap 152 that may each allow air to flow between top 102 of drive-plane board 100 and bottom 202 of drive-plane board 100 when drive-plane board 100 is installed in a storage-system drawer.

Figure 3:
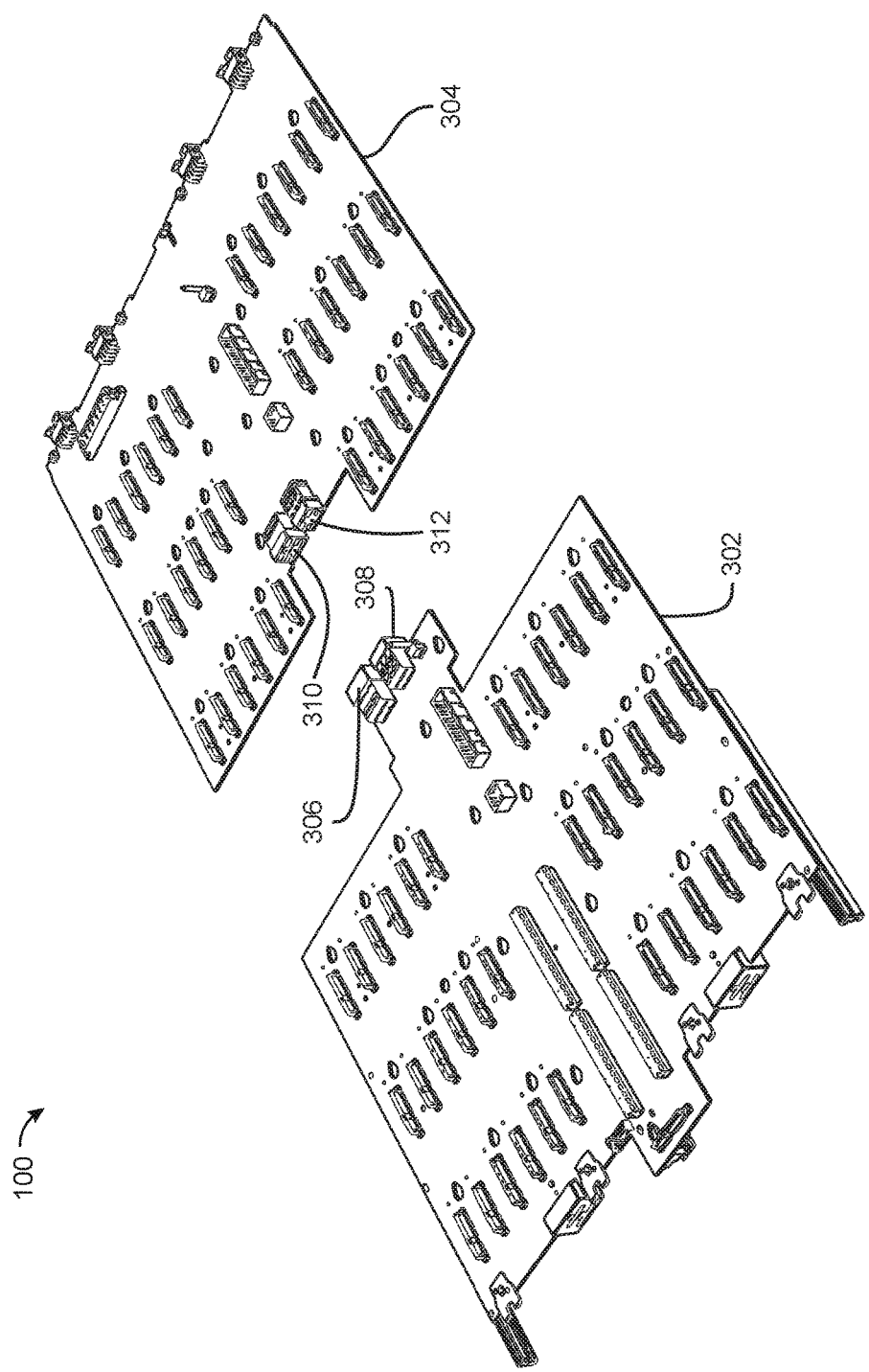
FIG. 3 is a perspective view of the exemplary drive-plane board illustrated in FIG. 1 in a disconnected state.
Figure 4:
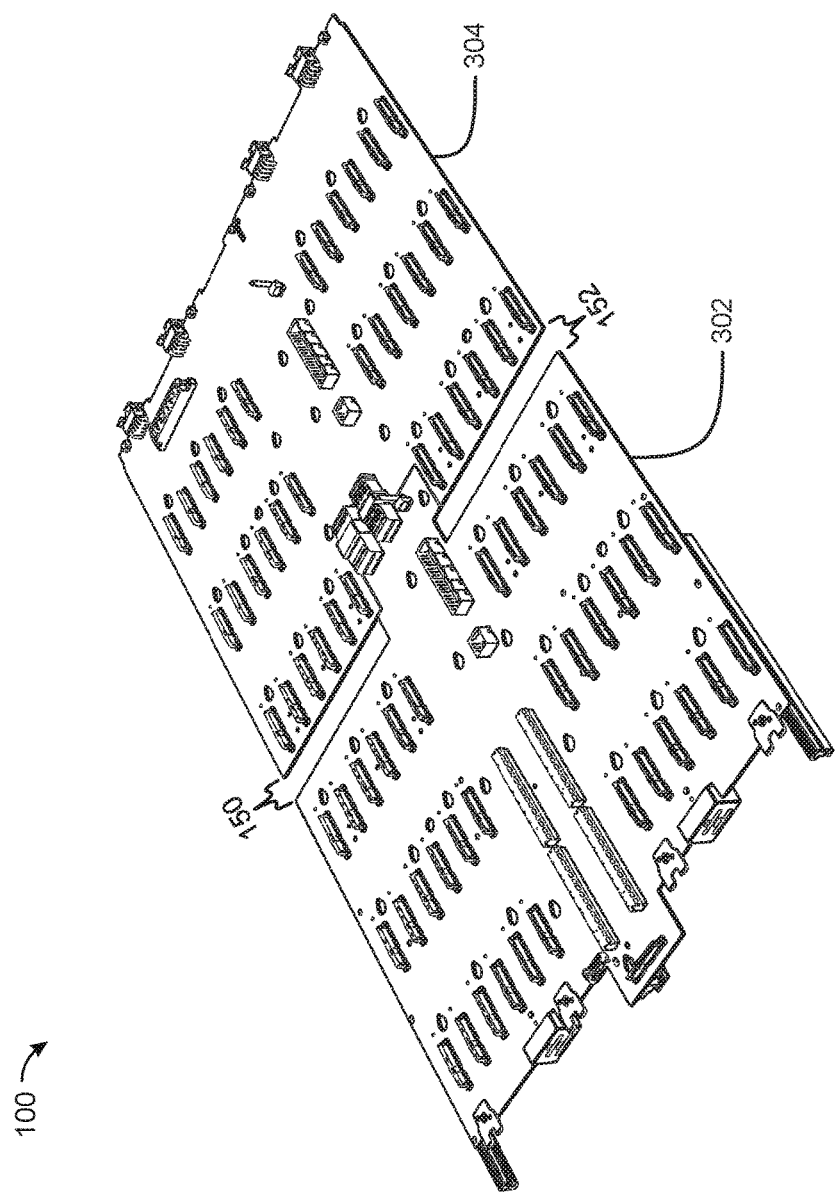
FIG. 4 is a perspective view of the exemplary drive-plane board illustrated in FIG. 1 in a connected state.

As illustrated in FIG. 3, drive-board 100 may be made up of one or more separable pieces. In the example shown, drive-board 100 may include a front PCB 302 and a rear PCB 304 that may be electrically coupled via high-speed connectors 306-312. In some examples, high-speed connectors 306-312 may provide power and communication pathways between the components of front PCB 302 and the components of rear PCB 304. As shown in FIGS. 1-4, left gap 150 in right gap 152 may be located between PCB 302 and PCB 304. As shown in FIG. 3, PCB 302 may include 36 of storage-drive connectors 104 for connecting a front section of storage drives, such as front section 504 in FIG. 5, to drive-plane board 100; and PCB 304 may include 36 of storage-drive connectors 104 for connecting a rear section of storage drives, such as rear section 506 in FIG. 5, to drive-plane board 100. As shown in FIG. 5, left gap 150 and right gap 152 may be approximately located between front section 504 and rear section 506.

Figure 6:
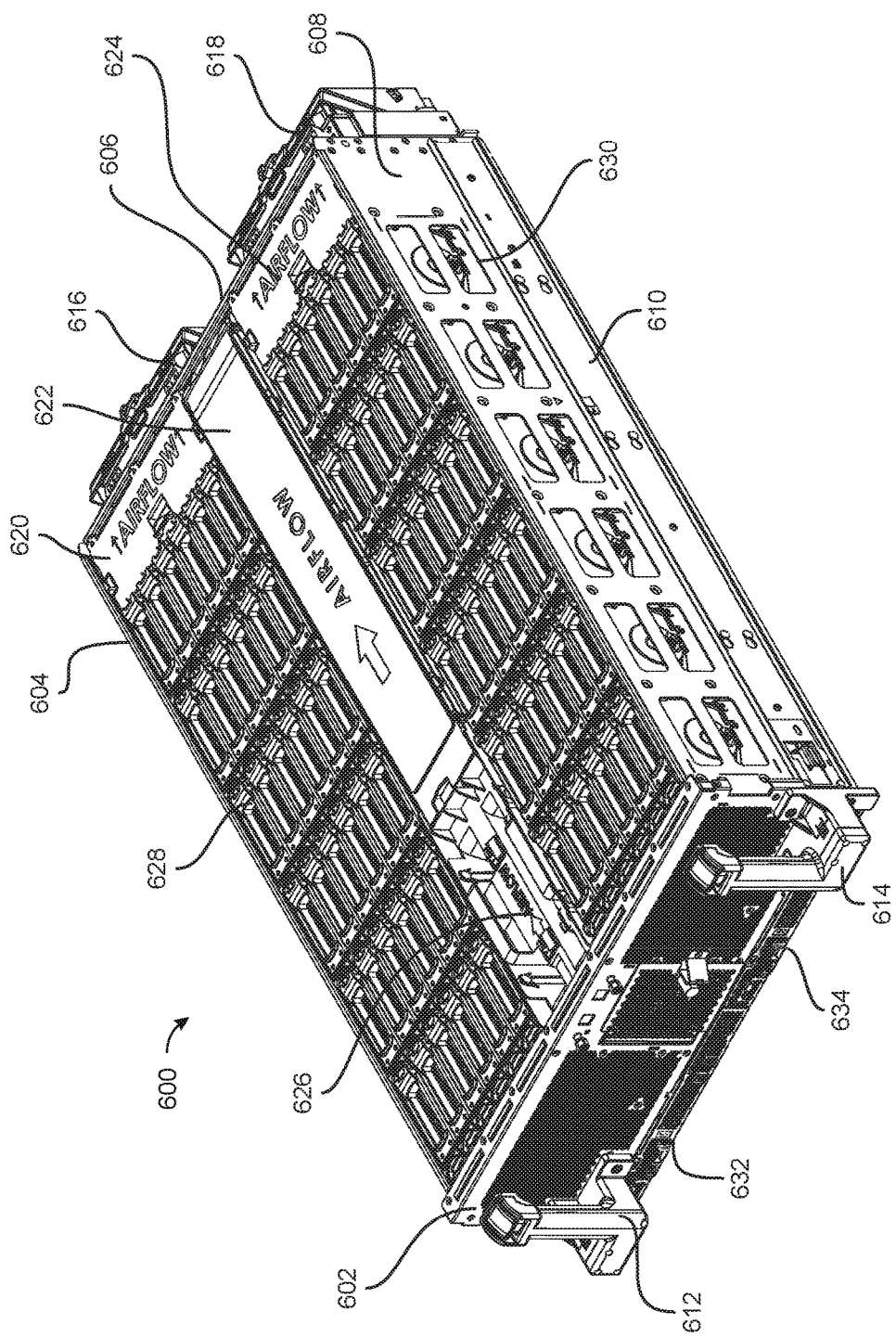
FIG. 6 is a perspective view of an exemplary storage-system drawer.
Figure 7:
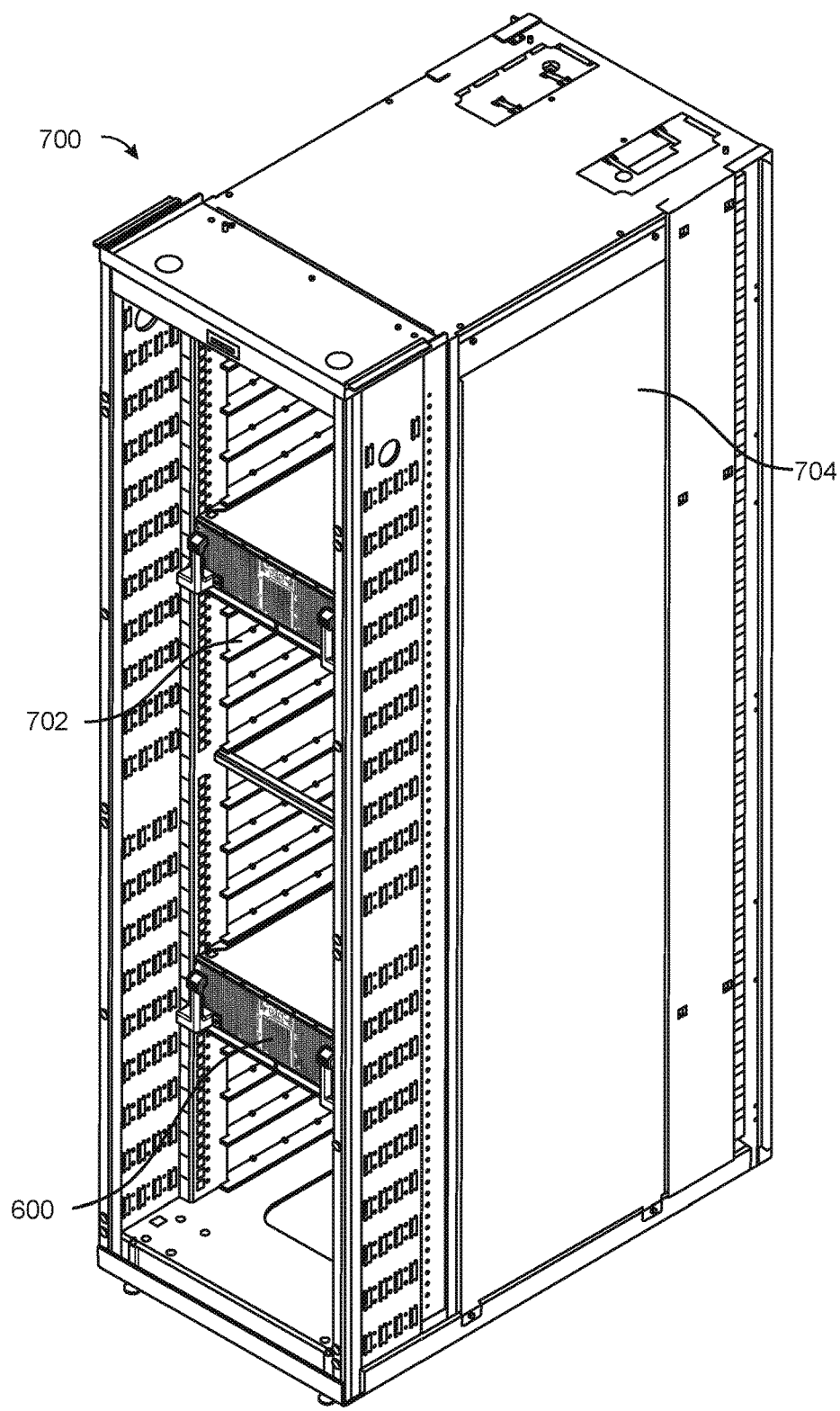
FIG. 7 is a perspective view of an exemplary data-center rack with several storage-system drawers.

FIG. 6 shows a perspective view of an exemplary storage-system drawer 600 within which drive-plane board 100 has been installed. The term "storage-system drawer," as used herein, generally refers to any structure that is adapted to house the various components that make up a storage system. In some examples, the chassis of storage-system drawer 600 may be sized to house all of the storage-system components illustrated in FIG. 5. The chassis of storage-system drawer 600 may also be adapted to be housed in a data-center rack 700 as illustrated in FIG. 7. In one example, storage-system drawer 600 may be positioned on a support tray (such as support tray 702) coupled to a frame 704 of data-center rack 700. As used herein, the term "data-center rack" generally refers to any multi-system chassis structure for housing multiple storage-system drawers and chassis and/or providing support for one or more cables that connect to the storage-system drawers and chassis. In some examples, a data-center rack may also contain power supplies, network switches, and/or battery backup units.

Returning to FIG. 6, storage-system drawer 600 may include a chassis (e.g., a metallic enclosure) made up of a front 602, a left side 604, a rear 606, and a right side 608. Front 602 may include pull-handle 612 and pull-handle 614 configured to enable a technician to easily pull storage-system drawer 600 out from and return storage-system drawer 600 to data-center rack 700. Front 602 may also include front-accessible I/O-module drawers, such as I/O-module drawers 632 and 634, that are adapted to secure I/O modules within storage-system drawer 600.

Figure 8:
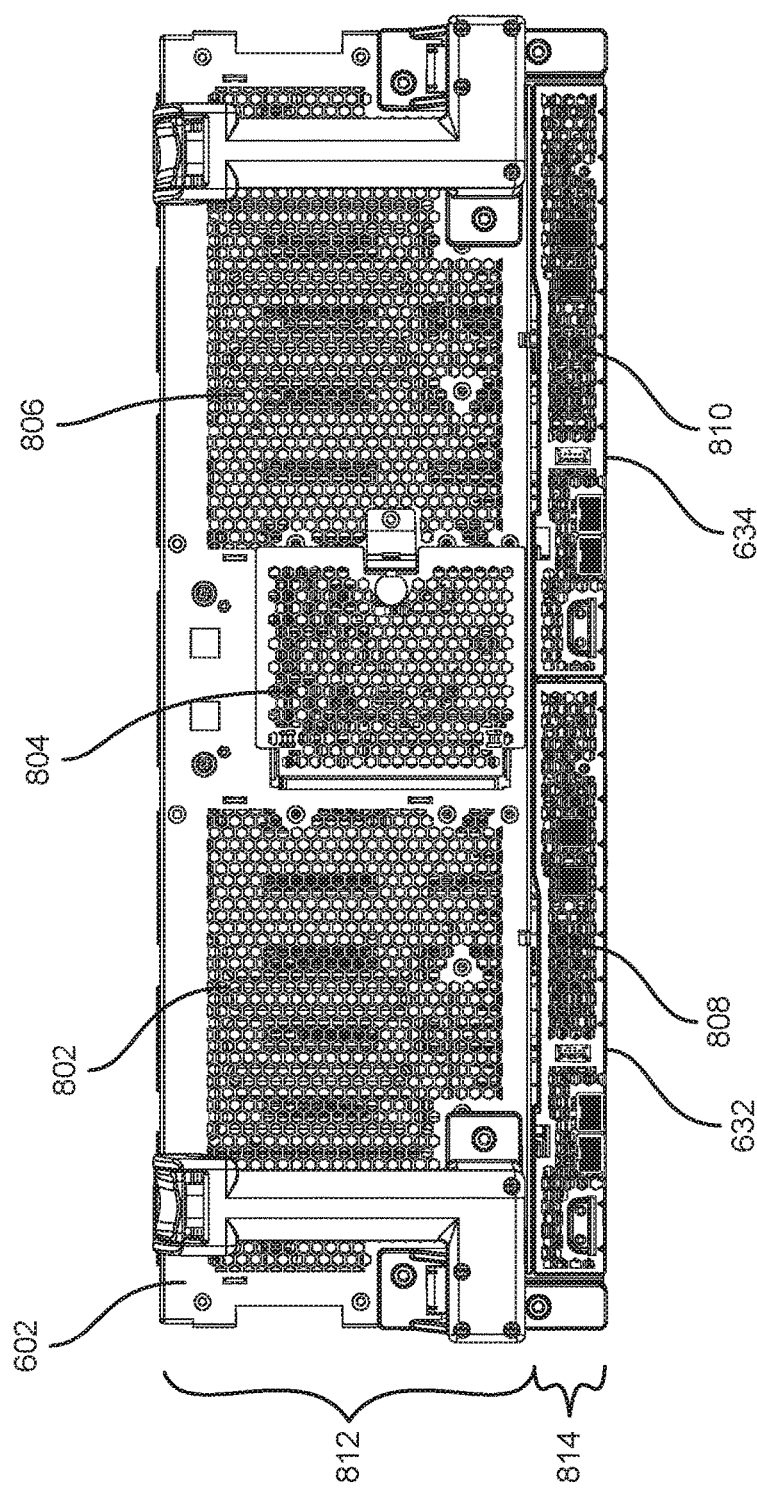
FIG. 8 is a front view of the exemplary storage-system drawer illustrated in FIG. 6.

As shown in FIG. 8, front 602 may include various air vents that allow air to pass through front 602, such as vents 802-810. In this example, vents 802-806 may be part of an upper venting section 812 that allows an airflow to enter the chassis of storage-system drawer 600 above drive-plane board 100 (e.g., airflow 1502 in FIG. 15), while vents 808 and 810 may be part of a lower venting section 814 that allows an airflow to enter the chassis of storage-system drawer 600 below drive-plane board 100 (e.g., airflow 1504 in FIG. 15). As illustrated in this example, vent 808 may be integrated into I/O-module drawer 632, and vent 810 may be integrated into I/O-module drawer 634.

As shown in FIG. 6, storage-system drawer 600 may include a fan module 616 and a fan module 618 removably attached to rear 606. In some examples, fan module 616 and fan module 618 may include one or more fans that pull an airflow (e.g., airflows 1502 and 1504 in FIG. 15) rearward through the chassis of storage-system drawer 600 for the purpose of cooling the storage-system components housed within storage-system drawer 600. In some examples, storage-system drawer 600 may include slide mechanisms (e.g., drawer-slide mechanism 610) that are coupled to left side 604 and right side 608 and enable storage-system drawer 600 to be fully extended out of data-center rack 700 for servicing.

In order to retain the airflows generated by fan units 616 and 618 and create plenum within its chassis, storage-system drawer 600 may include one or more airflow-retaining mechanisms such as a removable baffle 620, a removable cover 622, a removable baffle 624, and a removable cover 626. In some examples, the storage-drive latches contained within storage-system drawer 600 (e.g., latch 628) may include a clear film that creates plenum and enables a technician to view an enclosed storage drive when the latch is closed. In some examples, the sides of storage-system drawer 600 may include various holes and openings (e.g., opening 630) in order to reduce the weight of storage-system drawer 600. In these examples, light-weight films (e.g., mylar films) may be used to cover the holes and openings in order to prevent air from passing through the sides of storage-system drawer 600.

Figure 9:
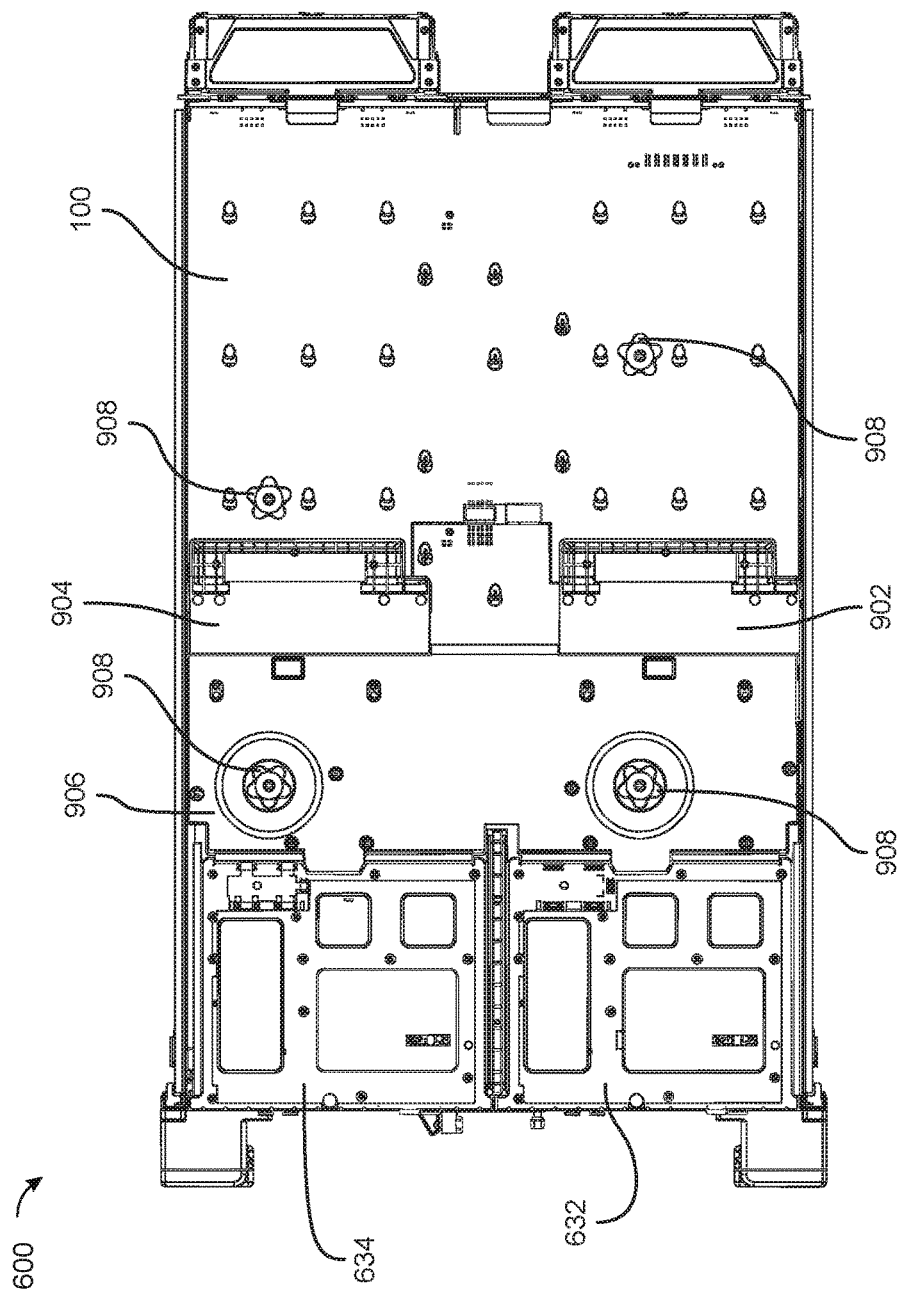
FIG. 9 is a bottom view of the exemplary storage-system drawer illustrated in FIG. 6.
Figure 10:
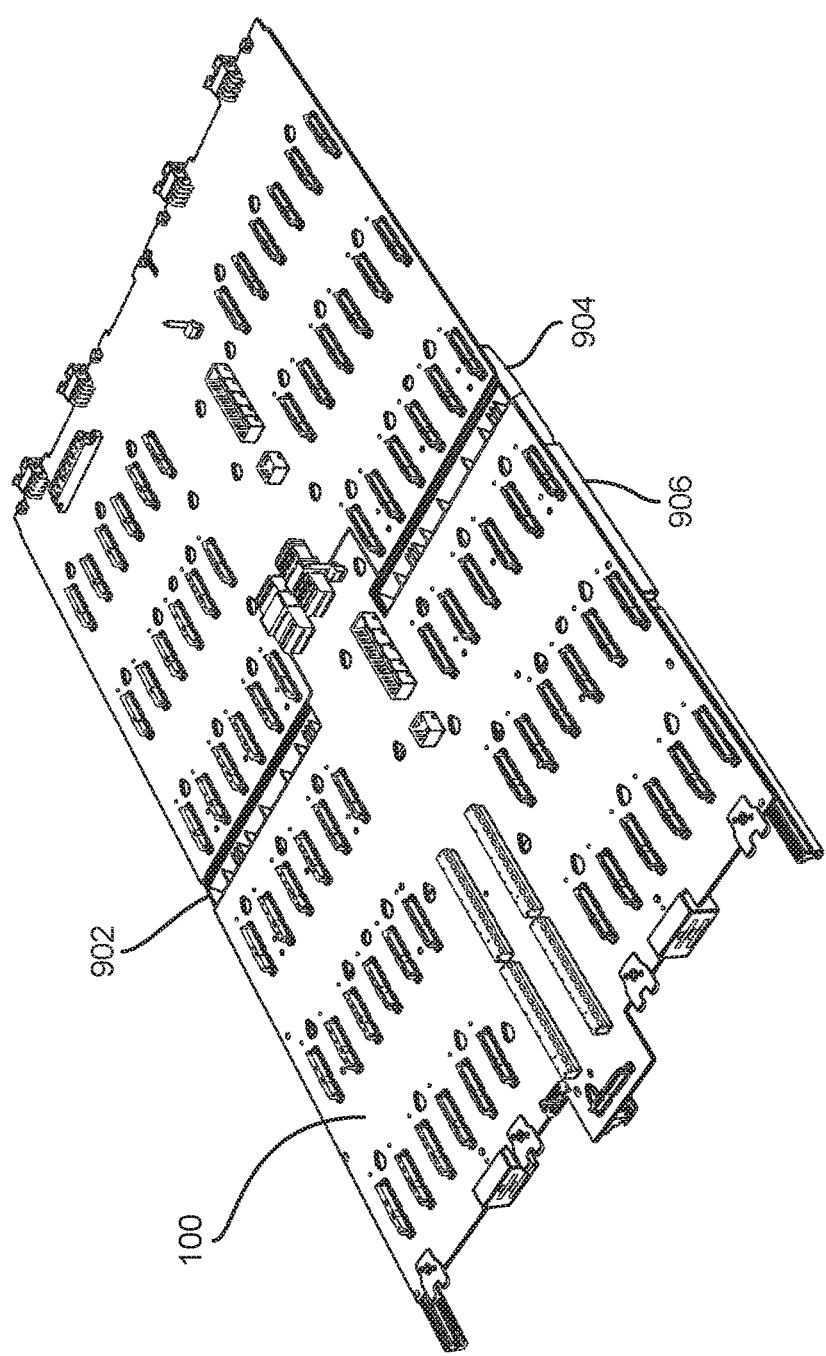
FIG. 10 is a perspective view of the exemplary drive-plane board illustrated in FIG. 1 with exemplary cold-air baffles.
Figure 15:
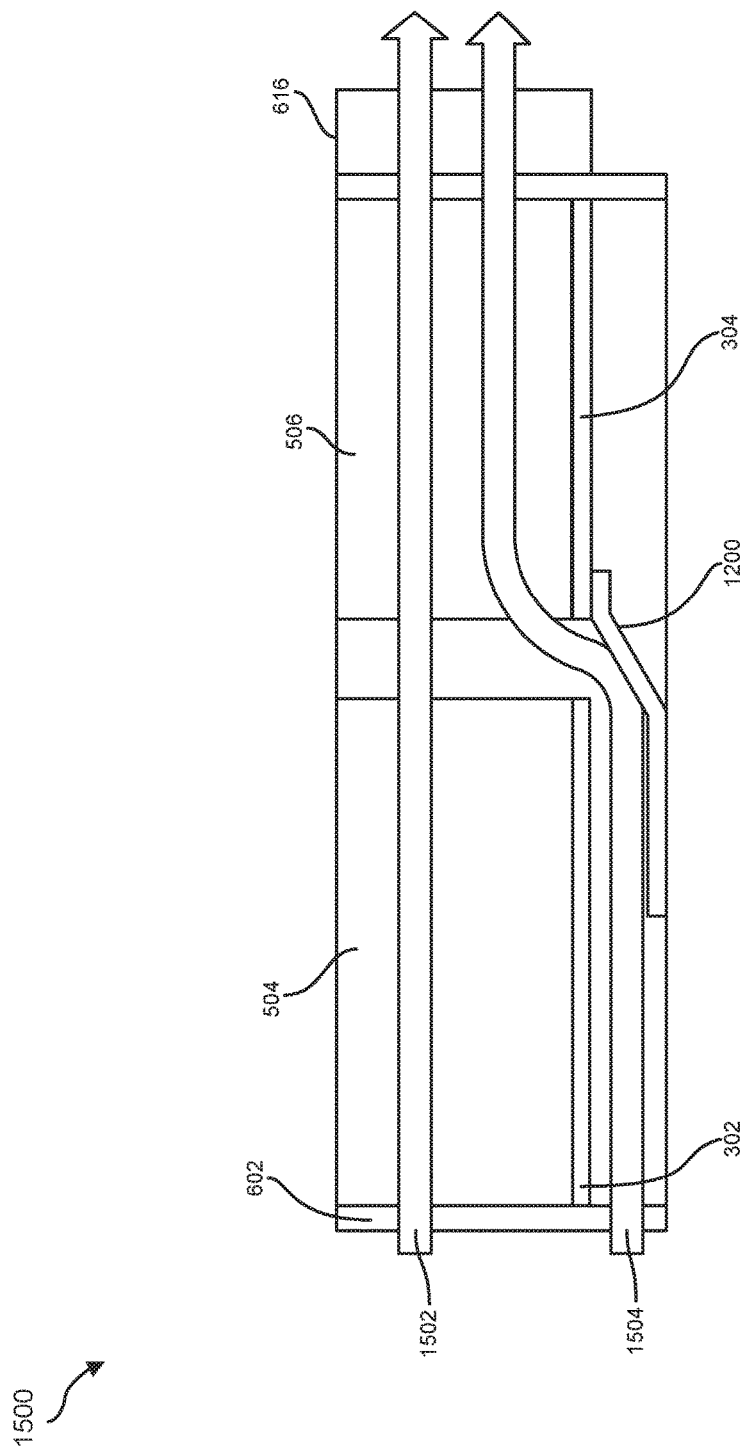
FIG. 15 is a block diagram of exemplary airflows passing through a storage-system drawer.

FIG. 9 shows a bottom view of storage-system drawer 600 with drive-plane board 100 installed. As shown, screws 908 may retain drive-plane board 100 within storage-system drawer 600. Storage-system drawer 600 may include a baffle 902, a baffle 904, and a baffle 906 that are sized and configured to direct air that enters the chassis of storage-system drawer 600 via vents 808 and 810 and that passes under PCB 302 up through left gap 150 and right gap 152, as illustrated in FIG. 15. As shown in FIG. 10, baffle 902 may be coupled to PCB 302 and PCB 304 and may direct air through left gap 150, baffle 904 may be coupled to PCB 302 and PCB 304 and may direct air through right gap 152, and baffle 906 may be coupled to PCB 302 and may direct air that flows through I/O-module drawers 632 and 634 to baffle 902 and baffle 904. In some examples, baffle 902, baffle 904, and baffle 906 may be sized and configured to retain the air that enters the chassis of storage-system drawer 600 via vents 808 and 810 within the chassis of storage-system drawer 600.

Figure 11:
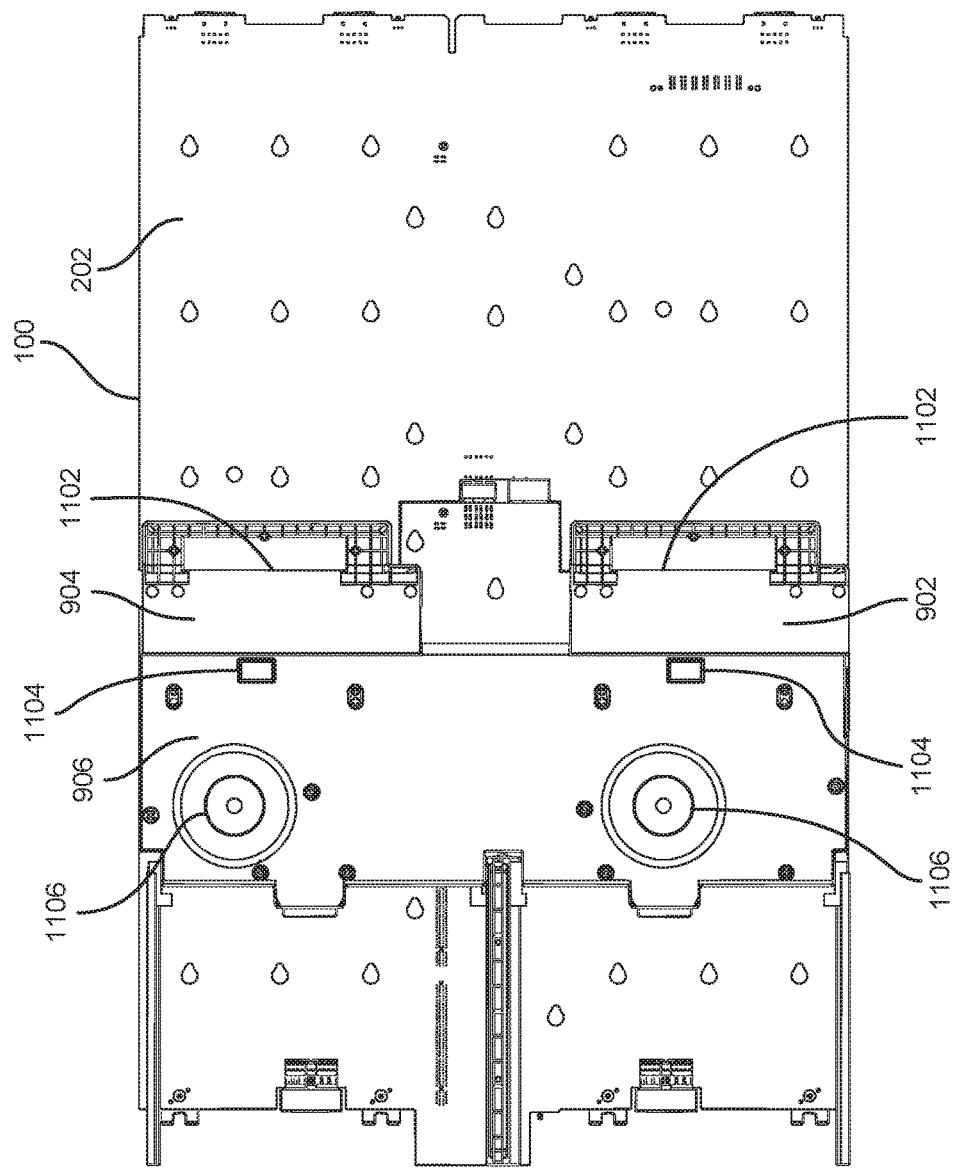
FIG. 11 is a bottom view of the exemplary drive-plane board illustrated in FIG. 1 with the exemplary cold-air baffles illustrated in FIG. 10.

FIG. 11 illustrates bottom 202 of drive-plane board 100 with baffles 902-906 attached. In one example, baffle 902 and baffle 904 may be coupled to drive-plane board 100 to provide structural rigidity to drive-plane board 100. When attached to drive-plane board 100, baffle 902 and baffle 904 may prevent PCB 302 and PCB 304 from being separated. In at least one example, baffle 902 and baffle 904 may be made from a rigid material, such as a rigid plastic. In some examples, baffle 902, baffle 904, and baffle 906 may include fingerholds, such as fingerholds 1102 and 1104, that enable a technician to grasp and/or remove drive-plane board 100 from storage-system drawer 600. As shown, baffle 906 may include openings 1106 configured to allow one of screws 908 to pass through baffle 906.

Figure 12:
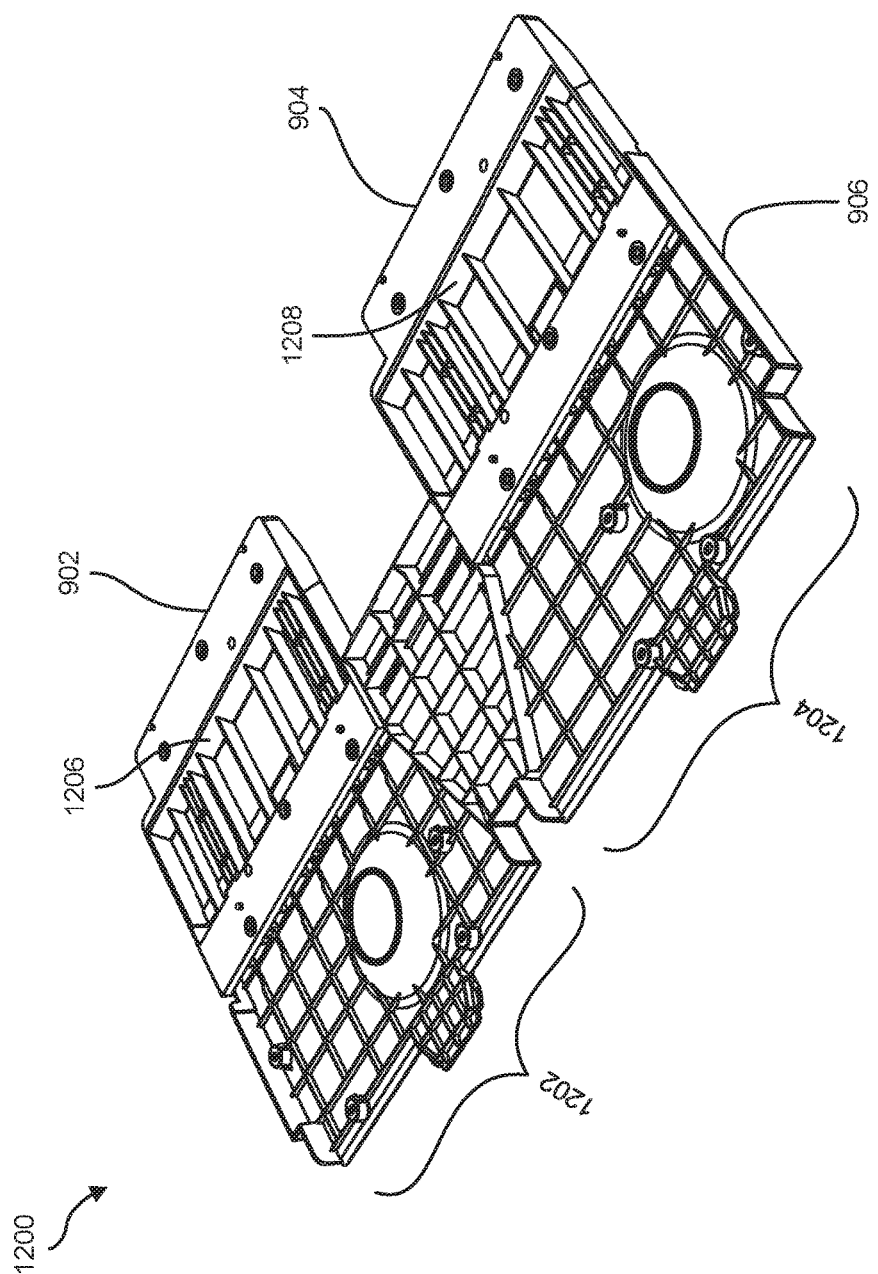
FIG. 12 is a perspective view of an exemplary cold-air baffle assembly.
Figure 13:
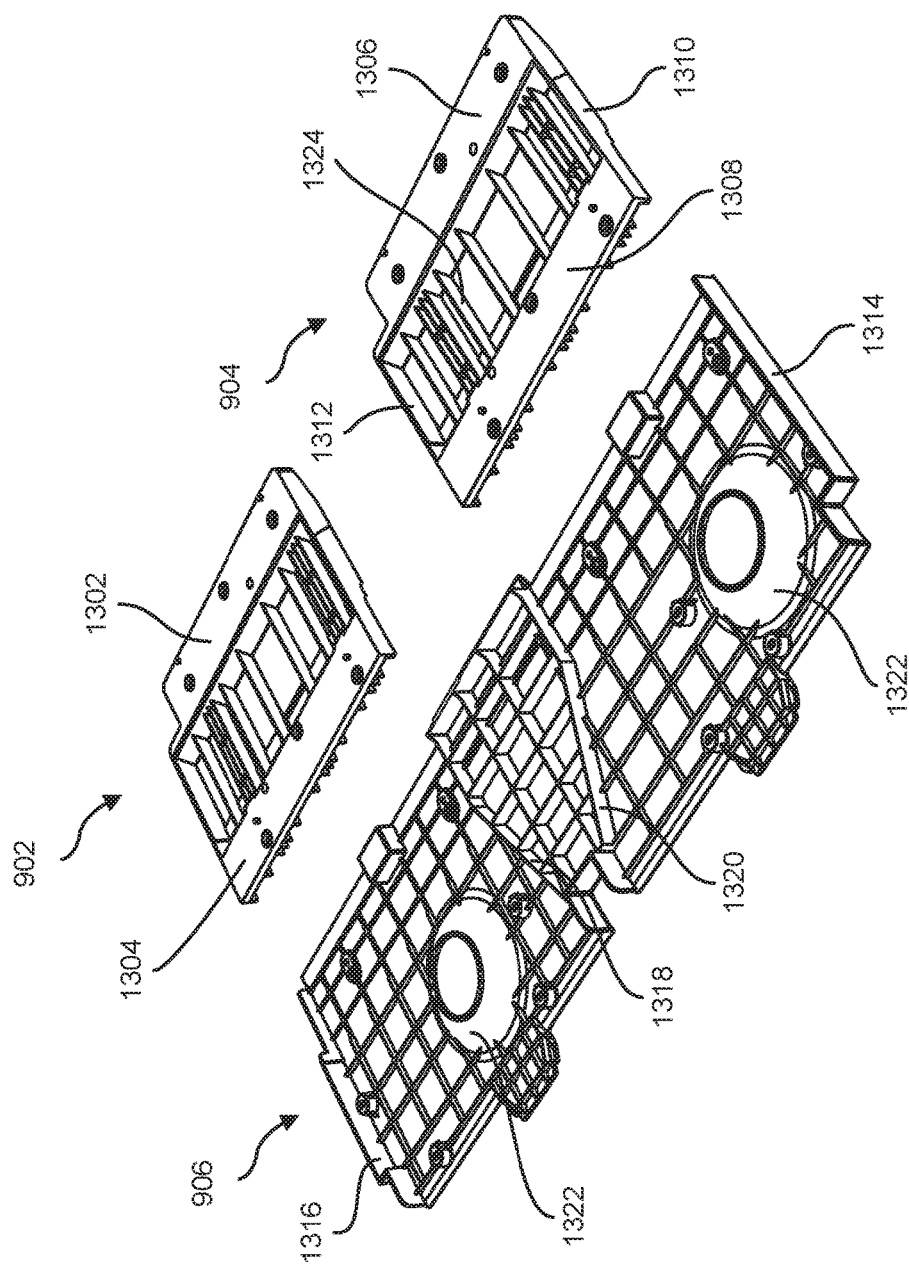
FIG. 13 is an exploded view of the exemplary cold-air baffle assembly illustrated in FIG. 12.

FIGS. 12 and 13 illustrate an exemplary baffle assembly 1200 made up of baffle 902, baffle 904, and baffle 906 in a connected and disconnected state, respectively. As shown in FIG. 12, baffle 906 may include a left section 1202 that is configured to direct air to baffle 902 and a right section 1204 that is configured to direct air to baffle 904. Baffle 902 may include an airflow-directing member 1206 that directs air upward, and baffle 904 may include an air-directing member 1208 that likewise directs air upwards. As shown in FIG. 13, baffle 902 may include mounting surfaces 1302 and 1304 that enable baffle 902 to be mounted flush against drive-plane board 100, and baffle 904 may include mounting surfaces 1306 and 1308 that enable baffle 904 to be mounted flush against drive-plane board 100.

Figure 14:
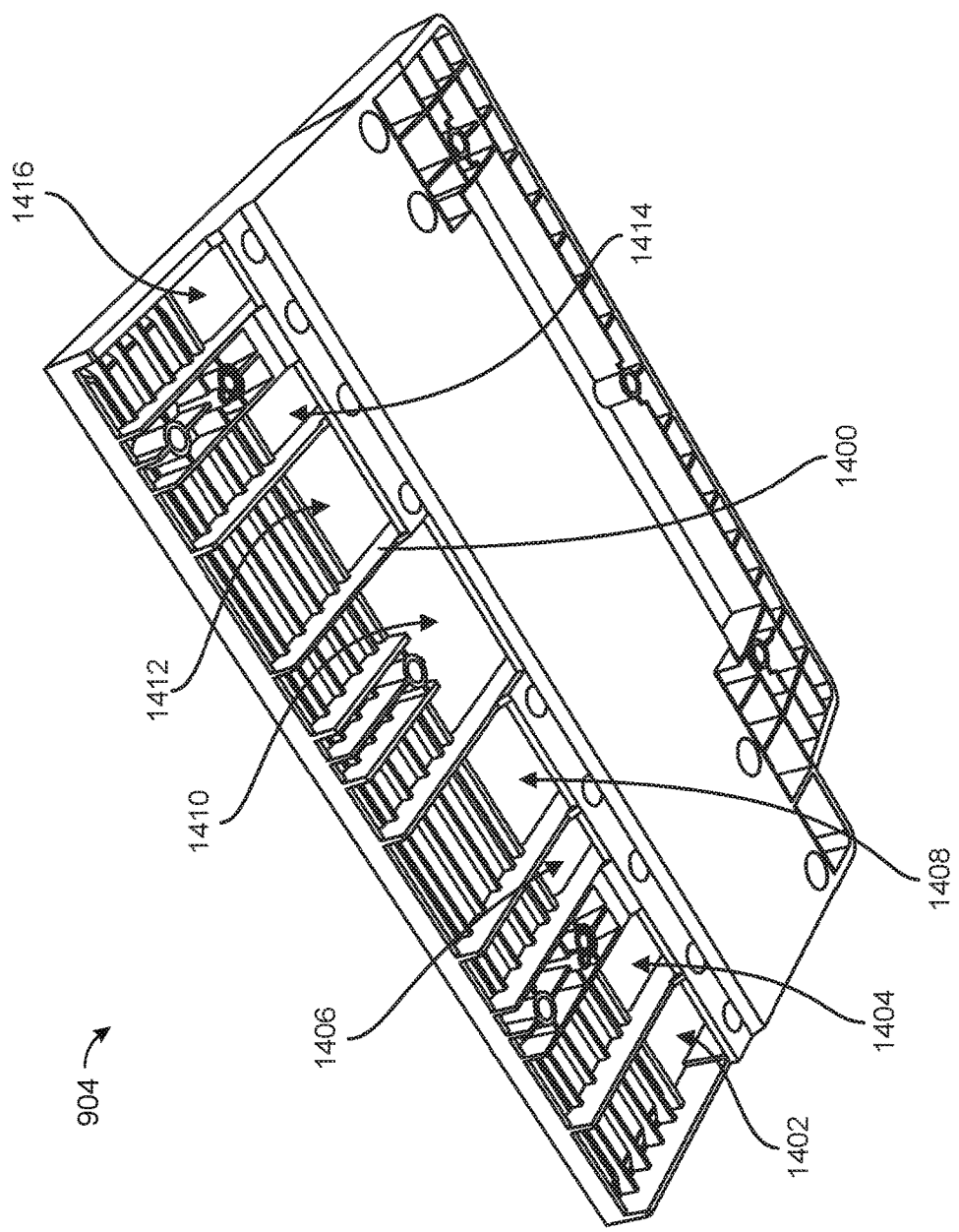
FIG. 14 is a perspective view of an exemplary cold-air baffle.

As shown in FIG. 13, each of baffles 902, 904, and 906 may have sidewalls, such as sidewall 1310, sidewall 1312, sidewall 3014, and sidewall 1316, that are configured to retain airflows within baffles 902, 904, and 906. Additionally, baffle 906 may include airflow-splitting walls 1318 in 1320 that direct airflows into baffles 902 and 904, respectively. Baffle 906 may also include conical walls 1322 that prevent, when baffle 906 is mounted against drive-plane board 100, air from escaping through openings 1106. As shown in FIGS. 13 and 14, baffle 904 may have ribs, such as rib 1324 and rib 1400, that form ducts that define openings 1402-1416 through which air may flow through baffle 904.

Figure 16:
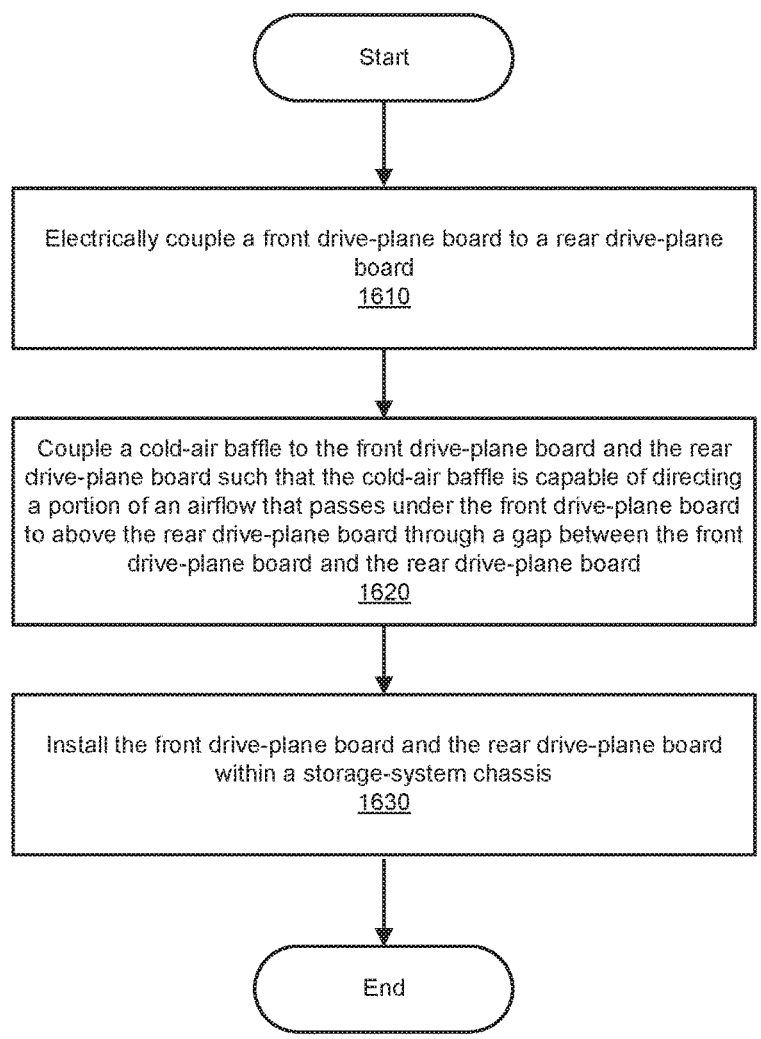
FIG. 16 is a flow diagram of an exemplary method for assembling and installing a drive-plane board with a cold-air baffle.

FIG. 16 illustrates a flow diagram of an exemplary method 1600 for assembling a drive-plane board that includes a cold-air baffle. As shown in FIG. 16, at step 1610, a front drive-plane board may be electrically coupled to a rear drive-plane board. Using FIGS. 3 and 4 as an example, PCB 302 may be electrically and mechanically coupled to PCB 304 via connectors 306-312.

At step 1620, a cold-air baffle may be coupled to the front drive-plane board and the rear drive-plane board such that the cold-air baffle is capable of directing a portion of an airflow that passes under the front drive-plane board to above the rear drive-plane board through a gap between the front drive-plane board and the rear drive-plane board. Using FIGS. 4 and 10 as an example, baffles 902 and 904 may be coupled to PCB 302 and PCB 304, as shown. In this example, baffle 902 may be capable of directing a portion of an airflow that passes under PCB 302 to above PCB 304 via left gap 150, and baffle 904 for may be capable of directing a portion of an airflow that passes under PCB 302 to above PCB 304 via right gap 152.

At step 1630, the front drive-plane board in the rear drive-plane board may be installed within a storage-system chassis. Using FIG. 9 as an example, PCB 302 and PCB 304 may be installed within storage-system drawer 600 as part of drive-plane board 100, as shown. In this example drive-plane board 100 may be removably affixed to storage-system drawer 600 via screws and 908.

As explained above, by using baffles to direct an airflow from under a storage-system chassis into the chassis through an opening in the bottom of the chassis located between rows of storage drives, the apparatus, systems, and methods disclosed herein may reduce the temperature of the air that passes through rows of storage drives at the rear of the chassis. By reducing the temperature of the air that passes through more rearward rows of storage drives in the storage-system chassis, the apparatus, systems, and methods disclosed herein may negate the negative thermal impact of hot air vented from storage drives at the front of the storage-system chassis on storage drives at the rear of the chassis and/or may reduce the amount of air that must be pushed through the storage-system chassis to maintain the operating temperatures of the storage drives contained within the chassis within the appropriate range.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A cold-air bypass apparatus comprising:
   one or more mounting surfaces configured to couple the cold-air bypass apparatus to a drive-plane board configured to be housed within a storage-system chassis, wherein:
      the storage-system chassis comprises a front through which air is able to pass, a left side through which substantially no air is able to pass, a right side through which substantially no air is able to pass, and a rear through which air is able to pass;
   a fan directs an airflow rearward through the chassis, the airflow comprising a first portion and a second portion; and
   the drive-plane board comprises:
      a front drive section located on a top side of the drive-plane board, the front drive section comprising a first plurality of storage-drive connectors coupled to the drive-plane board;
      a rear drive section located on the top of the drive-plane board, the rear drive section comprising a second plurality of storage-drive connectors coupled to the drive-plane board, wherein:
         the first portion of the airflow cools the front drive section and the rear drive section; and
         the second portion of the airflow substantially avoids cooling the front drive section by passing under the drive-plane board; and
      an opening located between the front drive section and the rear drive section that allows air to flow from below the drive-plane board to above the drive-plane board; and
   a baffle configured to combine the second portion of the airflow with the first portion of the airflow by directing the second portion of the airflow through the opening from below the drive-plane board to above the drive-plane board so that the second portion of the airflow and the first portion of the airflow combine to cool the rear drive section.

2. The cold-air bypass apparatus of claim 1, wherein the baffle is further configured to prevent substantially any of the airflow from flowing under the drive-plane board past the opening.

3. The cold-air bypass apparatus of claim 1, wherein:
   the drive-plane board comprises:
      a front printed circuit board that comprises the front drive section; and
      a rear printed circuit board electrically coupled to the front printed circuit board, the rear printed circuit board comprising the rear drive section; and
   the opening is a gap located between the front printed circuit board and the rear printed circuit board.

4. The cold-air bypass apparatus of claim 3, wherein:
   the baffle and the one or more mounting surfaces are formed from a single injection-molded part comprised of rigid plastic; and
   the one or more mounting surfaces are:
      coupled to the front printed circuit board and the rear printed circuit board; and
      configured to rigidly tie the front printed circuit board to the rear printed circuit board.

5. The cold-air bypass apparatus of claim 1, further comprising an additional baffle configured to:
   direct an additional portion of the airflow through an additional opening in the drive-plane board from below the drive-plane board to above the drive-plane board; and
   prevent substantially any of the airflow from flowing under the drive-plane board past the additional opening.

6. The cold-air bypass apparatus of claim 5, wherein:
   the drive-plane board comprises:
      a front printed circuit board that comprises the front drive section; and a rear printed circuit board coupled to the front printed circuit board, the rear printed circuit board comprising the rear drive section;

the opening is a gap located between the front printed circuit board and the rear printed circuit board; and the additional opening is an additional gap located between the front printed circuit board and the rear printed circuit board.

7. The cold-air bypass apparatus of claim 6, wherein:

the baffle and the one or more mounting surfaces are formed from a first injection-molded part comprised of rigid plastic;

the one or more mounting surfaces are:
coupled to a left side of the front printed circuit board and a left side of the rear printed circuit board; and
configured to rigidly tie the left side of the front printed circuit board to the left side of the rear printed circuit board;

the additional baffle and an additional one or more mounting surfaces are formed from a second injection-molded part comprised of rigid plastic; and the additional one or more mounting surfaces are:
coupled to a right side of the front printed circuit board and a right side of the rear printed circuit board; and
configured to rigidly tie the right side of the front printed circuit board to the right side of the rear printed circuit board.

8. The cold-air bypass apparatus of claim 5, further comprising a third baffle that extends from the left side of the chassis to the right side of the chassis, the third baffle configured to:

retain the second portion of the airflow against the drive-plane board;

direct the second portion of the airflow to the baffle;

retain the additional portion of the airflow against the drive-plane board; and direct the additional portion of the airflow to the additional baffle.

9. The cold-air bypass apparatus of claim 1, further comprising two or more finger holds that enable a technician to grasp and remove the drive-plane board from the chassis.

10. The cold-air bypass apparatus of claim 1, wherein the baffle comprises a duct through which the second portion of the airflow is able to pass.

11. A storage-system drawer comprising:

a chassis comprising a front through which air is able to pass, a left side through which substantially no air is able to pass, a right side through which substantially no air is able to pass, and a rear through which air is able to pass;

a fan that directs an airflow rearward through the chassis, the airflow comprising a first portion and a second portion;

a drive-plane board comprising:
a front drive section located on a top side of the drive-plane board, the front drive section comprising a first plurality of storage-drive connectors coupled to the drive-plane board;
a rear drive section located on the top of the drive-plane board, the rear drive section comprising a second plurality of storage-drive connectors coupled to the drive-plane board, wherein:
the first portion of the airflow cools the front drive section and the rear drive section; and
the second portion of the airflow substantially avoids cooling the front drive section by passing under the drive-plane board; and an opening located between the front drive section and the rear drive section that allows air to flow from below the drive-plane board to above the drive-plane board; and a cold-air baffle configured to combine the second portion of the airflow with the first portion of the airflow by directing the second portion of the airflow through the opening from below the drive-plane board to above the drive-plane board so that the second portion of the airflow and the first portion of the airflow combine to cool the rear drive section.

12. The storage-system drawer of claim 11, wherein the cold-air baffle is further configured to prevent substantially any of the airflow from flowing under the drive-plane board past the opening.

13. The storage-system drawer of claim 11, wherein:

the drive-plane board comprises:
a front printed circuit board that comprises the front drive section; and
a rear printed circuit board electrically coupled to the front printed circuit board, the rear printed circuit board comprising the rear drive section; and the opening is a gap located between the front printed circuit board and the rear printed circuit board.

14. The storage-system drawer of claim 13, wherein the cold-air baffle is:

comprised of rigid plastic;

coupled to the front printed circuit board and the rear printed circuit board; and configured to rigidly tie the front printed circuit board to the rear printed circuit board.

15. The storage-system drawer of claim 11, further comprising an additional cold-air baffle configured to:

direct an additional portion of the airflow through an additional opening in the drive-plane board from below the drive-plane board to above the drive-plane board; and prevent substantially any of the airflow from flowing under the drive-plane board past the additional opening.

16. The storage-system drawer of claim 15, wherein:

the drive-plane board comprises:
a front printed circuit board that comprises the front drive section; and
a rear printed circuit board coupled to the front printed circuit board, the rear printed circuit board comprising the rear drive section;

the opening is a gap located between the front printed circuit board and the rear printed circuit board; and the additional opening is an additional gap located between the front printed circuit board and the rear printed circuit board.

17. The storage-system drawer of claim 16, wherein the cold-air baffle and the additional cold-air baffle are each:

comprised of rigid plastic;

coupled to the front printed circuit board and the rear printed circuit board; and configured to rigidly tie the front printed circuit board to the rear printed circuit board.

18. The storage-system drawer of claim 11, wherein the fan is coupled to the rear of the chassis and pulls the airflow from the front of the chassis to the rear of the chassis.

19. The storage-system drawer of claim 11, wherein the cold-air baffle comprises two or more finger holds that enable a technician to grasp and remove the drive-plane board from the chassis.

20. A method comprising:
  electrically coupling a front drive-plane board to a rear drive-plane board, wherein:
    the front drive-plane board comprises a front drive section located on a top side of the front drive-plane board, the front drive section comprising a first plurality of storage-drive connectors coupled to the front drive-plane board;
    the rear drive-plane board comprises a rear drive section located on the top of the rear drive-plane board, the rear drive section comprising a second plurality of storage-drive connectors coupled to the rear drive-plane board; and
    a gap is located between the front drive-plane board and the rear drive-plane board;
  coupling a cold-air baffle to the front drive-plane board and the rear drive-plane board such that the cold-air baffle is capable of directing a portion of an airflow that passes under the front drive-plane board through the gap to above the rear drive-plane board; and
  installing the front drive-plane board and the rear drive-plane board within a storage-system chassis.

\* \* \* \* \*